(12) United States Patent
Swedo et al.

(10) Patent No.: US 7,317,064 B2
(45) Date of Patent: *Jan. 8, 2008

(54) PHENOLIC RESIN SYSTEMS FOR FIBER REINFORCED COMPOSITE MANUFACTURE

(75) Inventors: Raymond J. Swedo, Mount Prospect, IL (US); George David Green, Cary, IL (US)

(73) Assignee: Angus Chemical Company, Buffalo Grove, IL (US)

( * ) Notice: Subject to any disclaimer, the term of this patent is extended or adjusted under 35 U.S.C. 154(b) by 178 days.

This patent is subject to a terminal disclaimer.

(21) Appl. No.: 10/900,556

(22) Filed: Jul. 28, 2004

(65) Prior Publication Data
US 2005/0009980 A1    Jan. 13, 2005

Related U.S. Application Data

(63) Continuation-in-part of application No. 10/830,808, filed on Apr. 23, 2004, which is a continuation-in-part of application No. 10/383,272, filed on Mar. 7, 2003, now abandoned.

(51) Int. Cl.
*C08G 8/10* (2006.01)
*C08G 14/04* (2006.01)
*C08G 14/06* (2006.01)
*C08F 283/00* (2006.01)

(52) U.S. Cl. ............ 528/129; 528/145; 525/534; 524/540; 524/541; 548/517

(58) Field of Classification Search .......... 528/129, 528/145; 525/534; 524/540, 541; 548/517
See application file for complete search history.

(56) References Cited

U.S. PATENT DOCUMENTS

| 3,305,413 | A | 2/1967 | Flynn | |
|---|---|---|---|---|
| 4,053,447 | A | 10/1977 | Shea | 260/38 |
| 4,076,873 | A | 2/1978 | Shea | 428/35 |
| 4,107,127 | A | 8/1978 | Shea | 260/38 |
| 4,250,267 | A | 2/1981 | Hartdegen | |
| 5,075,413 | A | 12/1991 | Dailey, Jr. | 528/129 |
| 5,075,414 | A | 12/1991 | Dailey, Jr. | 528/129 |
| 5,202,189 | A | 4/1993 | Shea | 428/436 |
| 5,684,114 | A * | 11/1997 | Phillips et al. | 528/129 |
| 2001/0041782 | A1 | 11/2001 | Okuhira | |
| 2002/0183461 | A1 | 12/2002 | Okuhira | |
| 2004/0036056 | A1 | 2/2004 | Shea et al. | 252/182.13 |

FOREIGN PATENT DOCUMENTS

| EP | 0 666 296 A | 8/1995 |
|---|---|---|
| EP | 0705856 | 4/1996 |
| EP | 0368927 | 5/2000 |
| WO | WO89/01013 | 2/1989 |
| WO | WO97/18251 A | 5/1997 |

OTHER PUBLICATIONS

Derwent Abstract AN 1979-53365B for JP 54071120.

* cited by examiner

*Primary Examiner*—Duc Truong

(57) ABSTRACT

The invention includes formulations useful for creating reinforced composites based on 1) novolac resin compositions, and, 2) non-formaldehyde hardeners, as well as processes for manufacturing components using said reinforced composites.

12 Claims, No Drawings

PHENOLIC RESIN SYSTEMS FOR FIBER REINFORCED COMPOSITE MANUFACTURE

This application is a continuation-in-part of U.S. patent application Ser. No. 10/830,808 filed Apr. 23, 2004 now allowed, which is a continuation-in-part of U.S. patent application Ser. No. 10/383,272 filed Mar. 7, 2003 abandoned.

BACKGROUND OF INVENTION

1. Field of the Invention

The invention is directed toward phenolic resin compositions which are useful in the manufacture of reinforced composites.

2. Description of the Prior Art

Phenolic resins can be broadly divided into two general classes: novolacs and resoles. Novolac resins are generally characterized as being formaldehyde deficient. That is to say that the ratio of formaldehyde to phenolic groups is <1. Resole resins are generally characterized as being formaldehyde rich. That is to say that the ratio of formaldehyde to phenolic groups is >1. Both novolacs and resoles may incorporate a variety of phenolic compounds, alone or in combination, including but not limited to phenol, resorcinol, bisphenols, phloroglucinol, cresols, alkyl phenols, phenyl ethers, tannins, and lignins. Similarly, other aldehydes may be substituted in whole or in part for formaldehyde, including but not limited to acetaldehyde, propionaldehyde, cyclohexanedicarboxaldehydes, benzaldehydes, furfural, and other aryl or heterocyclic aldehydes.

Novolac resins are usually cured (crosslinked, hardened) through the use of formaldehyde, formaldehyde-donating hardener compounds, or formaldehyde equivalent compounds. Hexa-methylenetetramine (hexa) and paraformaldehyde are often used commercially to cure novolac resins. In addition to a source of formaldehyde, heating and the presence of a catalyst are usually employed to accelerate the rate and extent of curing. Catalysts may include inorganic bases such as sodium or potassium hydroxide, Lewis acids such as zinc chloride or zinc acetate, or amines such as triethylamine.

The ideal phenolic resin for composite applications such as pultrusion, filament winding or vacuum assisted resin transfer would possess a number of key attributes:

it would be capable of being formulated to give a liquid resin at ambient or near ambient temperature using little or no inert solvents;

it would have a low free phenolic monomer content;

it would be able to utilize processing equipment made with standard materials of construction;

it would be curable through reaction with hardeners.

Depending upon their molecular weight, resole resins can be either solids or liquids. They are cured by heating either alone or, more typically, in the presence of an acid catalyst. Composite applications are currently dominated by liquid resole resin formulations almost to the exclusion of novolacs. Yet, resoles do not possess the ideal solution because their acid catalysts require the use of processing equipment made from costly, acid-resistant materials. Furthermore, the acid catalysts necessary for curing severely limit their processing window (pot life) and storage stability. Another drawback of resoles is their relatively high solvent content needed to keep the formulation viscosity within acceptable processing parameters.

Novolac resins are typically solids that require heating in the presence of a hardener (formaldehyde source or equivalent) in order to cure to a crosslinked resin. These products are ideally suited for molding applications where the resins are compounded (blended) with hardeners, fillers, and reinforcements. However, there are certain applications, such as adhesives and composites, where it is more advantageous to use a liquid resin system. Liquid novolac resins are most often obtained in one of three ways:

by mixing the solid resins with aqueous base;

by dissolving the resin in an organic solvent;

by employing a large excess of phenolic monomer to act as a reactive diluent.

While the water or organic solvent based formulations may be suitable for adhesive applications or for the preparation of certain prepregs, they are not desirable for composite applications where the trapped solvents lead to the generation of voids. Offgassing of solvents is not the issue with formulations containing excess phenolic monomers. Rather, the large excess of free monomers may result in undesirably long curing times or worker exposure issues.

The potential usefulness of phenolic-based fiber reinforced composites has long been recognized. The excellent flame, smoke and toxicity (FST) properties of phenolics in fire situations have made them the material of choice in the construction of aircraft interiors, rail coaches and other areas with high concentrations of people with limited egress routes. Unfortunately, phenolic polymers and their composite systems are also well known to be difficult to process and the final parts brittle.

Dailey, in two closely related U.S. Pat. Nos. 5,075,413 and 5,075,414, discusses the need for phenolic resin systems with improved processing capabilities. Specifically, he discloses the use of mixtures of phenolic resoles with resorcinol-based novolacs to provide a low temperature cure system while retaining the excellent FST properties of phenolics. He additionally discusses the use of liquid methylene donors to partially dissolve paraformaldehyde thereby reducing the overall solvent content of the resin formulations. This was anticipated to provide enhanced physical properties of the final composite parts through reduced void content.

Shea also has several patents relating to fire resistant phenolic resin compositions for use in composites. In U.S. Pat. No. 4,053,447, he discusses the use of mixtures of aldehydes with paraformaldehyde to cure resorcinol-based novolac resins. The aldehydes were said to give improved resistance to cracking and embrittlement without sacrificing FST properties. In U.S. Pat. No. 4,107,127, he discloses the use of paraformaldehyde with aqueous formaldehyde to cure resorcinol based novolac resins with improved embrittlement properties without sacrificing FST properties. Shea patents U.S. Pat. No. 4076873, EP0368927, WO 89/01013 and U.S. Pat. No. 5,202,189 are similar to the aforementioned Shea art in that they discuss resorcinol-based novolacs cured with mixtures of formaldehyde(s) and other aldehydes. In US patent application 2004/0036056, he specifically discusses the use of a four part, non-formaldehyde-containing hardener for phenolic resin systems useful for composites. His hardener consists of a non-formaldehyde methylene donor, a pH adjuster, a viscosity adjuster and a polymerization shortstop to retard the polymerization. He also claims a small amount of water in the hardener system is required for proper cure to be obtained.

SUMMARY OF INVENTION

Novolac resins can be cured using standard hardeners such as hexa, paraformaldehyde, or formaldehyde in aqueous or organic solvent solutions. However, it is envisioned within the scope of this invention that the preferred hardeners be chosen from among several classes of novel hardeners including oxazolidines, nitroalcohols, hydroxylamines, aminonitroalcohols, nitroamines, nitroolefins, nitroacetals, nitrones, amines, imines, halonitroparaffins, oxazines, azaadamantanes, hexamethylenetetramine salts, imidazolidines, triazines, nitrooxazolidines, imidazolidine-oxazolidine hybrids and hexahydropyrimidines used either alone or in various combinations with each other and/or with hexa or paraformaldehyde. The hardener systems are the subject of co-pending U.S. patent application Ser. Nos. 10/830,808 and 10/383,272, the disclosures of which are incorporated herein by reference. The hardeners are effective in curing a wide range of phenolic novolac resins. Through the judicious selection of these hardeners, used either alone or in various combinations, it is possible to advantageously vary the processing parameters of these phenolic resin systems. Higher curing rates, reduced volatiles emission and reduced post-cure cycles are advantageous improvements as compared to standard hexa-cured systems. These process improvements and reduction in cycle time have obvious economic benefits.

The resin systems described in this invention can be applied in any application where phenolic resins are used, including but not limited to adhesives, molding compounds, foundry materials, abrasives, friction materials, insulation, laminates, coatings, prepregs, electronics, fire resistant, and flame-retardant end uses. These liquid novolac formulations are well suited for pultrusion, filament winding, and vacuum assisted resin transfer composite applications. In particular, we have developed formulations that are ideally formulated for pultrusion and filament winding. The formulations, pultrusion processing, filament winding processing and final composite parts are all within the scope of this invention.

DETAILED DESCRIPTION OF INVENTION

The invention includes formulations useful for creating reinforced composites based on 1) novolac resin compositions, and, 2) non-formaldehyde hardeners. These formulations are liquids, moderate in viscosity and suited for use in composite manufacturing. Additionally, the process for curing these formulations in the presence of reinforcements and the resulting cured plastics are also covered. The novolac resins may be based on combinations of aromatic monomers and such resins are described in the examples of this patent. Additionally, the resin systems may or may not include solvents and vary in pH depending on their method of preparation. For this invention, the resins are used as a solution in reactive diluent or solvent with a pH ranging from 8-12. Examples of reactive diluents are phenol, substituted phenols, aliphatic aldehydes other than formaldehyde, furfural or furfuryl alcohol, and low molecular weight phenolic resole resins. Examples of solvents include methanol, ethanol, higher alcohols, benzyl alcohol, glycols, glycol ethers, esters, water, and other typical low cost organic solvents that will solvate the novolac resin.

The curing agents, i.e., hardeners and catalysts, may be drawn from a wide variety of existing and new oxazolidines, nitroalcohols, nitroacetals, nitroolefins, nitroamines, aminonitro-alcohols, hexahydropyrimidines, nitrones, hydroxylamines, imines, oxazines, triazaadamantanes, hexa salts, and halogenated derivatives of these compounds. These are described fully in U.S. patent application Ser. No. 10/830,808 and co-pending U.S. patent application Ser. No. 10/383,272, the disclosures of which are incorporated herein by reference. More specifically for this invention, the curing agents are ideally oxazolidines, nitroalcohols, hexahydropyrimidines and their mixtures.

The fiber reinforcements will typically be glass, either as fibers or mats. The use of other fibrous reinforcements such as carbon, basalt, graphite or synthetic fibers or mats is within the scope of this invention. The critical parameter limiting the use of a given reinforcement with our systems is the processing temperature. If the melting/decomposition point of the reinforcement is above the processing temperature required by the resin system, then it may be used.

It will be clear from the examples that these novel formulations are an improvement over the known art in that a simple, liquid, two part resin (a) and hardener (b) package is sufficient for composite part manufacture with physical properties superior to a conventional resole while retaining the excellent FST properties of a classic phenolic system. Additionally, the demonstrated array of possible curing agents provides a broad spectrum of useful processing conditions for any given novolac resin system.

EXAMPLES

Durez PF novolac resin Varcum 29-607 was a commercial sample. The anisaldehydes, phenyl ether (DPE), anisole, phenol, resorcinol, the cresols, 4-t-butylphenol, 4-nonylphenol, zinc acetate, and all common laboratory acids, bases, solvents, and reagents were obtained from the Aldrich Chemical Company. Oxazolidines 5-ethyl-1-aza-3,7-dioxabicyclo[3.3.0]octane, 4,4-dimethyl-1-oxa-3-azacyclopentane, the nitroalcohol tris(hydroxymethyl)nitromethane, were all obtained from the ANGUS Chemical Company. 5-Hydroxymethyl-1-aza-3,7-dioxabicyclo[3.3.0]octane (M-3P) was obtained from Uniroyal. 2-Bromo-2-nitro-1,3-propanediol (Bronopol) was obtained from Dow Biocides. Other materials were synthesized as described in U.S. patent application Ser. No. 10/830,808 and co-pending U.S. patent application Ser. No. 10/383,272, the disclosures of which are incorporated herein by reference.

GPC Analyses:

GPC analyses were performed using a Waters Model 590 LC system with Plgel columns and THF eluent. Polystyrene standards were used for calibration.

DSC Analyses:

DSC analyses were performed using a TA Instruments Model Q100 differential scanning calorimeter. Scans for screening hardeners with Varcum 29-607 novolac were run from 25° C. to 400° C. at $\Delta T=10°$ C./minute with a nitrogen flow of 50 cc/minute. Non-hermetic aluminum pans were used. A small hole was punched in the top before crimping. Scans to obtain $T_g$ data for low melting/liquid novolac resins were run from −50° C. to 150° C. at $\Delta T=10°$ C./minute with a nitrogen flow of 50 cc/minute using high volume (100 μl) aluminum pans. Scans for the analysis of the curing performance of formulations based on low melting/liquid novolac resins were run from 25° C. to 250° C. at $\Delta T=10°$ C./minute with a nitrogen flow of 50 cc/minute using high volume aluminum pans. After holding the samples at the maximum temperature for 10 minutes, the samples were cooled back to room temperature, then the scans were re-run to obtain $T_g$ data.

Example 1—Reactive Diluent Blends

A series of physical mixtures of hardeners and phenolic monomers were made. The objective was to develop liquid blends of reactive novolac components ("reactive diluents") that could be used to decrease the viscosity of novolac resins without introducing water or other organic solvents that would off-gas during curing, leading to voids and delamination in the cured parts. The blends made are shown in the Table below:

| SAMPLE NO. | COMPONENTS | MOLE RATIO | PHYSICAL FORM |
|---|---|---|---|
| 14A | Furfural/resorcinol | 1:1 | Undissolved resorcinol |
| 14B | Furfural/resorcinol | 2:1 | Homogeneous low viscosity liquid |
| 14C | ZT/CS-1246 | 1:1 | Undissolved ZT |
| 14D | ZT/furfural/resorcinol | 1:2:1 | Gelled at room temperature |
| 14E | TN/furfural/resorcinol | 1:2:1 | Undissolved TN |
| 14F | ZT/CS-1246/CS-1135 | 1:1:1 | Low viscosity liquid |
| 14G | TN/CS-1246/CS-1135 | 1:1:1 | Low viscosity liquid |
| 14H | TN/CS-1135 | 1:1 | Low viscosity liquid |
| 14I | ZT/furfural/m-cresol | 1:2:1 | Low viscosity liquid |
| 14J | ZT/furfural/m-cresol | 1:1:1.33 | Low viscosity liquid |
| 14K | ZT/furfural/m-cresol | 1:1:1 | Low viscosity liquid |
| 14L | TN/furfural/m-cresol | 1:2:1 | Undissolved TN |
| 14M | CS-1246/furfural/m-cresol | 1:1:1 | Low viscosity liquid |

Example 2—Comparative DSC Data Survey—New Hardeners

In order to demonstrate the utility of the hardeners disclosed in this invention, a series of formulations were prepared using only one commercially available PF novolac resin (Durez Varcum 29-607). Any variations observed in the curing behavior of these formulations could therefore be attributed to the hardener/catalyst being evaluated. Hexa was used as the baseline for comparison since it is the hardener used most extensively in the industry.

The formulations were evaluated using a differential scanning calorimeter (DSC; TA Instruments Model Q100) to observe curing onset and peak temperatures and heats of curing for the curing events taking place. The DSC scans were run at $\Delta T=10°$ C./minute from 25° C. to 400° C. under a nitrogen flow of 50 cc/minute. The data obtained in this study are summarized in the Table below.

The classes of hardeners evaluated herein are those disclosed in U.S. patent application Ser. No. 10/830,808 and co-pending U.S. patent application Ser. No. 10/383,272, the disclosures of which are incorporated herein by reference.

NOVEL PHENOLIC RESINS
Comparative DSC Survey with Durez PF Novolac 29-607
TA Instruments Model Q 100 DSC
Run Conditions: 10 C./minute from 25 C. to 400 C. with N2 at 50 cc/min.

| RESIN FORMULATION | | | CURING EVENTS | |
|---|---|---|---|---|
| HARDENER | PHR | CLASS | ONSET/PEAK C. (HEAT, J/g) | ONSET/PEAK C. (HEAT, J/g) |
| HEXA | 5.39 | Am-baseline | 140/153 (69) | 244/255 (72) |
| Hexa-BzCl | 10 | Hex-S | 142/157 (70) | |
| Hexa-BNM | 8.6 | Hex-S | 129/164 (72) | |
| NTA | 8.6 | AZA | 180/197 (173) | |
| NTA/IPHA | 8.6/5.0 | AZA-HA | 170/192 (245) | |
| | 8.6/2.5 | AZA-HA | 173/194 (133) | |
| | 8.6/1.0 | AZA-HA | 173/194 (155) | |
| ATA | 15 | AZA | 98/116 (17) | 171/214 (78) |
| | 8.6 | AZA | 105/117 (15) | 169/200 (77) |
| TN | 11.11 | NA | 198/208 (254) | |
| TN/DMTA | 9.0/1.0 | NA-Am | 171/191 (106) | |
| TN/Hexa | 9.0/1.0 | NA-Am | 147/182 (80) | ca. 210/ca. 230 (49) |
| NMPD | 15 | NA | 198/212 (83) | |
| NMPD/IPHA | 10.0/5.0 | NA-HA | 139/140 (3) | ca. 150/196 (103) |
| Bronopal | 20 | NA | 219/236 (302) | |
| Bronopol/IPHA | 15.0/5.0 | NA-HA | 163/190 37) | 212/241 (126) |
| Fur-IPHA | 15 | NIT | 194/229 (170) | |
| TN/Fur-IPHA | 12.8/5.0 | NIT-NA | 185/200 (177) | |
| | 5.0/5.0 | NIT-NA | 189/203 (122) | |
| Tere-IPHA | 15 | NIT | 218/243 (182) | |
| Glut-IPHA | 15 | NIT | 191/229 (160) | |
| | 7.5 | NIT | 196/229 (90) | |
| Gly-IPHA | 15 | NIT | 147/179 (255) | |
| TN/Gly-IPHA | 12.8/5.0 | NIT-NA | 164/179 (226) | |
| | 5.0/5.0 | NIT-NA | 157/179 (124) | |
| Gly-PHA | 15 | NIT | 130/165 (417) | |
| TN/Gly-PHA | 5.0/5.0 | NIT-NA | 153/174 (187) | |
| Gly-EHA | 15 | NIT | 128/161 (273) | |
| TN/Gly-EHA | 5.0/5.0 | NIT-NA | 142/169 (160) | |
| NMP-An | 15 | NAm | 158/181 (11) | |
| TN/NMP-An | 10.0/5.0 | NA-NAm | 183/197 (201) | |
| FUR/monoZE | 25 | OX | ca.88/ca.100 | ca. 125/ca. 150 |
| FUR/ZE (1:2) | | | | |
| IPA-OZ | 10 | OZ | 87/113 (73) | ca. 150/169 (61) |

CLASS:
Am = amine
NAm = nitroamine
OX = oxazolidine
NIT = nitrone
HA = hydroxylamine
AZA = triazaadamantane
NA = nitroalcohol
Hex-S = hexamethylenetetramine salt
OZ = oxazine
Phen = substituted phenol salts The DSC data shown in the Table above display a wide variation in curing behavior depending on the hardener used. This variation in cure behavior is important in developing formulations as it allows the cure onset temperature, formulation pot life and cure time to be optimized for a given application.

The hardener package and reactive diluent are only a portion of the full formulation required for composite applications. The properties of the phenolic novolacs also play a critical role in determining the utility of a given formulation. In order to fully define our invention, it was necessary to demonstrate the utility of a wide range of phenolic novolacs. As only a few variants of low molecular weight novolacs are commercially available, we synthesized a wide variety novolacs by using combinations of monomers.

Liquid or low melting (low $T_g$) novolac resins having a wide range of properties can be synthesized by the careful selection of components chosen from aromatic monomers, aldehydes, and phenolic monomers. Some specific examples of these classes of compounds include, but are not limited to the following:

Examples of Aromatic Monomers

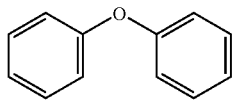
F.W. 170.21
M.P. 26–30C
DPE

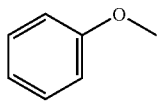
F.W. 108.14
B.P. 154C
ANISOLE

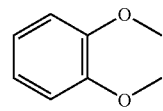
F.W. 138.17
M.P. 15C
VERATROLE

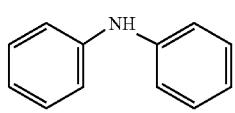
F.W. 169.23
M.P. 52–54C
DIPHENYLAMINE

Examples of Aldehydes

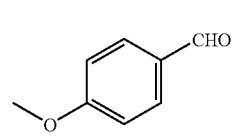
F.W. 136.15
M.P. -1C
p-ANISALDEHYDE

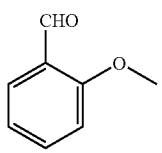
F.W. 136.15
M.P. 34–40C
o-ANISALDEHYDE

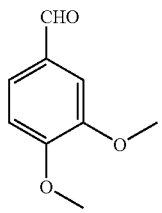
F.W. 166.18
M.P. 42–45C
VERATRALDEHYDE

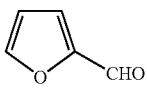
F.W. 96.09
B.P. 162C
FURFURAL

HCHO
F.W. 30.02
FORMALDEHYDE

Examples of Phenolic Monomers

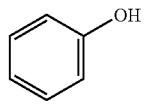
F.W. 94.11
M.P. 40–42C
PHENOL

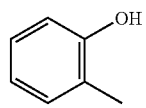
F.W. 108.14
M.P. 32–34C
o-CRESOL

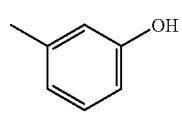
F.W. 108.14
M.P. 32–34C
m-CRESOL

-continued

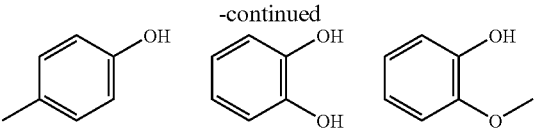

F.W. 108.14
M.P. 32-34C
p-CRESOL

F.W. 110.11
M.P. 104–106C
CATECHOL

F.W. 124.14
M.P. 27–29C
GUAIACOL

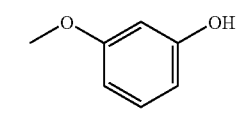
F.W. 124.14
B.P. 113–115C/5
m-METHOXYPHENOL

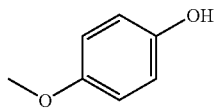
F.W. 124.14
M.P. 55–57C
MEHQ

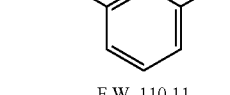
F.W. 110.11
M.P. 110–112
RESORCINOL

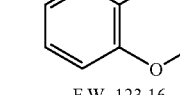
F.W. 123.16
M.P. 5–6C
o-ANISIDINE

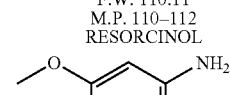
F.W. 123.16
M.P. -1 -1C
m-ANISIDINE

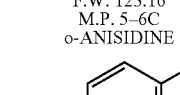
F.W. 123.16
M.P. 57–60C
p-ANISIDINE

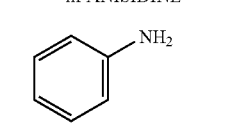
F.W. 93.13
M.P. -6C
ANILINE

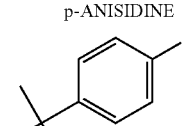
F.W. 150.22
t-BUTYL PHENOL

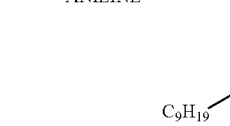
F.W. 220.35
NONYL PHENOL

In order to achieve certain desirable properties of the cured or uncured novolac resins one or more components from each of the classes above may be incorporated. The resins may be synthesized either by one-step or two-step processes with acidic, basic, or Lewis acid catalysts as appropriate for the reactivities of the chosen components.

Example 3—Two-Step Synthesis of Novolac Resins Containing Aromatic Monomers and Alternative Aldehydes Novolac Resins Containing Aromatic Monomers and Alternative Aldehydes (Method A): The general two-step procedure described below was used to synthesize several resins that incorporated DPE and/or anisole. The same procedure was followed in the preparation of resins that contained m- and/or p-anisaldehyde in place of formaldehyde. Resin characterization data are summarized in the Table below.

A 500 mL jacketed resin kettle was charged with 34.04 g (0.20 moles) of DPE, 21.63 g (0.20 moles) of anisole, 73.11 g (1.22 moles) of glacial acetic acid, and 50.37 g (0.62 moles) of 37 wt. % aqueous formaldehyde solution. The solution was stirred under a nitrogen blanket, then 10 mL of concentrated sulfuric acid were added. The solution turned light olive green. The solution was stirred under nitrogen at 95° C. for 24 hours, then 41.5 g (0.44 moles) of phenol were added in 4 portions over a 15 minute period. Heating at 95-100° C. was continued for a further 10 hours. The reaction mixture was cooled to room temperature, then 250 mL of ethyl acetate were added. The solution was filtered free of a small amount of insoluble solids. The bulk of the acetic and sulfuric acids were neutralized—initially by the portionwise addition of solid sodium bicarbonate, and finally by the addition of saturated aqueous sodium bicarbonate solution. The addition of 400 mL of water allowed the mixture to separate into a lower, aqueous layer and an upper, product solution in ethyl acetate. The product solution was dried over anhydrous magnesium sulfate, then the solvent was removed by rotary evaporation to give 100.4 g (93%) of product as a clear, brown, viscous resin. GPC analysis gave $M_w$=2223 and $M_N$=718. DSC analysis showed a $T_g$=8° C.

Example 4—One-Step Synthesis of Novolac Resins

One-Step Synthesis With Zinc Acetate Catalyst (Method B): The general one-step procedure using zinc acetate catalyst described below was used to synthesize several resins used in this study. Resin characterization data are summarized in the Table below.

A 3-neck flask equipped with a heating mantle, mechanical stirrer, distillation head with graduated receiver, thermocouple for temperature control and a $N_2$ blanket was charged with p-cresol (34.86 g, 0.30 mol), paraformaldehyde (6.0 g, 0.2 mol) and zinc acetate dihydrate (0.90 g, 0.004 mol). The mixture was brought to 105° C. where a homogeneous solution was obtained. After 2 hours, the mixture was warmed to 125° C. where water began to distill out of the reactor. Vacuum was slowly applied to the reaction mixture to induce the remainder of the water to distill. A vacuum of 40 torr had been achieved in 20 minutes, and this was maintained for an additional 5 minutes. The reaction was terminated via cooling under $N_2$; approximately 3.5 mL water had been collected (3.6 mL theory). The product was an opaque, yellow-brown solid. GPC analysis gave $M_w$=595 and $M_N$=334. DSC analysis showed a $T_g$=30° C.

One-Step Synthesis With Oxalic Acid Catalyst (Method C): A 3-neck flask equipped with a heating mantle, mechanical stirrer, distillation head with graduated receiver, thermocouple for temperature control and a nitrogen blanket was charged with phenol (28.7 g, 0.31 mol), 4-t-butylphenol (45.29 g, 0.31 mol), formaldehyde (37.2 mL of 37% aqueous solution, 0.5 mol) and oxalic acid (0.9 g, 0.01 mol). The mixture was brought to 80° C. where a homogeneous solution was obtained. After 80 minutes the mixture had become hazy. After 180 minutes, the mixture was warmed to 100-110° C. where water distilled out of the reactor. After 35 minutes, approximately 25 mL of water had been collected (theoretical water=34 g). Vacuum was slowly applied to the reaction mixture to induce the remainder of the water to distill. A vacuum of 170 torr had been achieved in 15 minutes, and this was maintained for an additional 15 minutes. The reaction was terminated via cooling under $N_2$; 35 mL distillate (34 mL water, 1 mL oil phase) had been collected. The product was a solid, off-white, translucent mass. GPC analysis gave $M_w$=979 and $M_N$=425. DSC analysis showed a $T_g$=32° C.

As is obvious to anyone skilled in the art of resin preparation, the resin systems will vary in pH depending on the method of preparation. For the purposes of this invention, the resin pH should be in the range of 8-12. Adjustments to the resin formulation to increase, or decrease pH may be made. Typical agents used to increase resin pH would include (but not limited to) metal hydroxides such as sodium hydroxide, potassium hydroxide, lithium hydroxide; amine compounds such as triethylamine, DABCO, 1,1,3,3-tetramethylguanidine, DBN, DBU, alkoxides, phenoxides, quaternary ammonium hydroxides and other organic or inorganic bases. Agents useful for decreasing resin pH would include mineral acids, sulfuric acid, alkyl sulfonic acids, aryl sulfonic acids, carboxylic acids, phosphoric acid, and other organic and inorganic acids.

While not preferred, it is also within the scope of this patent that a resin outside the pH range of 8-12 could be utilized. In these cases, the pH adjustments, utilizing the agents described above, may be made directly on the final formulations.

NOVEL PHENOLIC RESINS
Compositions and Properties of Liquid/Low Melting Novolac Resins

| Resin No. | POLYMER COMPOSITION | MOLE RATIO | SYNTHESIS METHOD | MOLECULAR WEIGHT $M_W$ | $M_N$ | $T_g$ ° C. | $T_M$ ° C. | RESIN FORM | NTBK REF |
|---|---|---|---|---|---|---|---|---|---|
| 15A | phenyl ether/formaldehyde/phenol | 1:1.55:1.1 | A | 1774 | 761 | 9 | (none) | viscous liquid | 2221-31 |
| 15B | anisole/p-anisaldehyde/phenol | 1:1.55:1.15 | A | 731 | 161 | 33 | ca.50 | solid | 2221-19, 27 |
| 15C | phenyl ether/anisole/formaldehyde/Phenol | 0.5:0.5:1.55:1.1 | A | 2223 | 718 | 3 | (none) | viscous liquid | 2221-37 |
| 15D | anisole/p-anisaldehyde/m-anis-aldehyde/phenol | 1:0.78:0.78:1.1 | A | 1272 | 1205 | 41 | ca.50 | solid | 2221-43 |
| 15E | glutaraldehyde/phenol | 1:3.75 | A | 5529 | 449 | 37 | ca.69 | solid | 2221-49 |
| 15F | cyclohexanedicarboxaldehyde/Phenol | 1:3.75 | A | 2733 | 387 | 96 | ca.113 | solid | 2221-59 |
| 16A | paraformaldehyde/p-cresol | 2:3 | B | 595 | 3343 | 30 | (none) | solid | 1641-48 |
| 16B | paraformaldehyde/p-cresol/o-cresol/4-t-butylphenol | 2:1:1:1 | B | 668 | 416 | 27 | (none) | solid | 1641-49 |

-continued

NOVEL PHENOLIC RESINS
Compositions and Properties of Liquid/Low Melting Novolac Resins

| Resin No. | POLYMER COMPOSITION | MOLE RATIO | SYNTHESIS METHOD | MOLECULAR WEIGHT $M_W$ | $M_N$ | $T_g$ °C. | $T_M$ °C. | RESIN FORM | NTBK REF |
|---|---|---|---|---|---|---|---|---|---|
| 16C | paraformaldehyde/phenol/4-nonylphenol | 5:3:3 | B | 2559 | 809 | 37 | (none) | solid | 1641-50 |
| 16D | paraformaldehyde/phenol/4-t-butylphenol | 4:2.5:2.5 | B | 1774 | 267 | | | tacky solid | 1641-57 |
| 16E | formaldehyde/phenol | 5:6 | C | 4869 | 687 | 53 | 86 | solid | 3178-24 |
| 16F | formaldehyde/phenol/4-t-butylphenol | 5:3.1:3.1 | C | 979 | 425 | 32 | 53 | solid | 3178-26 |
| 16G | formaldehyde/phenol/4-nonylphenol | 5:3.1:3.1 | C | 1089 | 471 | −9 | (none) | taffy-like | 3178-66 |
| 16H | formaldehyde/phenol/m-cresol/4-nonylphenol | 3:1:2:1 | C | 33743 | 894 | −4 | (none) | soft solid | 1641-69 |
| 16I | paraformaldehyde/bisphenol-A/4-nonylphenol | 2:2:1 | C | 1629 | 750 | 37 | 54 | glassy solid | 1641-70 |

Example 5—Comparative Formulation Survey of Low Melting/Liquid Novolac Resins A key objective of this invention was the development of novolac resin formulations that were free of water, contained minimal amounts of inert solvents, and that demonstrated reasonable flow properties at temperatures of 25-40° C. These formulations are anticipated to be useful in fiber reinforced composite applications requiring the coating of fibers with a thermosetting liquid resin. Pultrusion and filament winding are two such examples of composite applications.

A large number of novel hardeners have been disclosed herein, and a significant number of reactive diluent blends have been described. Combining the reactive diluents/hardeners with the varieties of novolac resins prepared above creates a vast number of formulations that could be generated from these components. Therefore, for the purpose of demonstrating the concept, this formulation survey was conducted using a representative selection of components. No attempt was made to optimize the formulations, and most of the formulations are not balanced. That is, most of the formulations are deficient in hardener equivalents with respect to the resin acceptor capacity.

Formulation flow characteristics were observed at both 40° C. and at 70° C., although those at the lower temperature were of greater interest. The formulation survey data are summarized in the Table below.

Compositions and Properties of Liquid/Low Melting Novolac Resin Formulations

| Formulation No. | RESIN | HARDENER/ REACTIVE DILUENT | PHR | TEMP., °C. | FORMULATION PROPERTIES | NTBK. REF. |
|---|---|---|---|---|---|---|
| 18-1 | 15A | Ox1 | 30 | 40 | viscous, clear, light yellow, flows freely | 02221-68B |
| 18-2 | 15A | IPA-OZ | 30 | 40 | extremely viscous, clear, dark brown, no flow | 02730-13C |
| 18-3 | 15A | NA2 | 30 | 40 | viscous, clear, orange, flows readily | 02730-14C |
| 18-4 | 15B | Ox1 | 30 | 40 | very viscous, clear, deep red, almost no flow | 02221-68C |
| 18-5 | 15B | IPA-OZ | 30 | 40 | extremely viscous, deep red, no flow | 02730-13B |
| 18-6 | 15B | NA2 | 30 | 40 | extremely viscous, clear, deep red, no flow | 02730-14B |
| 18-7 | 15C | Ox1 | 30 | 40 | viscous, clear, light amber, flows freely | 02221-68D |
| 18-8 | 15C | IPA-OZ | 30 | 40 | extremely viscous, clear, dark brown, no flow | 02730-13D |
| 18-9 | 15C | NA2 | 30 | 40 | viscous, clear, orange, flows freely | 02730-14D |
| 18-10 | 15D | Ox1 | 30 | 40 | very viscous, clear, deep red, almost no flow | 02221-68E |
| 18-11 | 15D | IPA-OZ | 30 | 40 | extremely viscous, deep red, no flow | 02730-13E |
| 18-12 | 15D | NA2 | 30 | 40 | extremely viscous, deep red, no flow | 02730-14E |
| 18-13 | 15E | Ox1 | 30 | 40 | very viscous, clear, brown, almost no flow | 02221-68F |
| 18-14 | 15E | IPA-OZ | 30 | 40 | wet solid | 02730-13F |
| 18-15 | 15E | NA2 | 30 | 40 | extremely viscous, clear, dark brown, no flow | 02730-14F |
| 18-16 | 15F | NA2 | 30 | 40 | wet solid | 02730-14G |
| 18-17 | 16A | Ox1 | 30 | 70 | extremely viscous, cloudy yellow, no flow | 02730-18A |
| 18-18 | 16A | IPA-OZ | 30 | 70 | extremely viscous, incomplete mix, brown, no flow | 02730-19A |
| 18-19 | 16A | NA2 | 30 | 70 | wet solid | 02730-19A |

| No. | RESIN | HARDENER/ REACTIVE DILUENT | PHR | °C. | FORMULATION PROPERTIES | REF. |
|---|---|---|---|---|---|---|
| 18-1 | 15A | Ox1 | 30 | 40 | viscous, clear, light yellow, flows freely | 02221-68B |
| 18-2 | 15A | IPA-OZ | 30 | 40 | extremely viscous, clear, dark brown, no flow | 02730-13C |
| 18-3 | 15A | NA2 | 30 | 40 | viscous, clear, orange, flows readily | 02730-14C |
| 18-4 | 15B | Ox1 | 30 | 40 | very viscous, clear, deep red, almost no flow | 02221-68C |
| 18-5 | 15B | IPA-OZ | 30 | 40 | extremely viscous, deep red, no flow | 02730-13B |

-continued

Compositions and Properties of Liquid/Low Melting Novolac Resin Formulations

| | | | | | | |
|---|---|---|---|---|---|---|
| 18-6 | 15B | NA2 | 30 | 40 | extremely viscous, clear, deep red, no flow | 02730-14B |
| 18-7 | 15C | Ox1 | 30 | 40 | viscous, clear, light amber, flows freely | 02221-68D |
| 18-8 | 15C | IPA-OZ | 30 | 40 | extremely viscous, clear, dark brown, no flow | 02730-13D |
| 18-9 | 15C | NA2 | 30 | 40 | viscous, clear, orange, flows freely | 02730-14D |
| 18-10 | 15D | Ox1 | 30 | 40 | very viscous, clear, deep red, almost no flow | 02221-68E |
| 18-11 | 15D | IPA-OZ | 30 | 40 | extremely viscous, deep red, no flow | 02730-13E |
| 18-12 | 15D | NA2 | 30 | 40 | extremely viscous, deep red, no flow | 02730-14E |
| 18-13 | 15E | Ox1 | 30 | 40 | very viscous, clear, brown, almost no flow | 02221-68F |
| 18-14 | 15E | IPA-OZ | 30 | 40 | wet solid | 02730-13F |
| 18-15 | 15E | NA2 | 30 | 40 | extremely viscous, clear, dark brown, no flow | 02730-14F |
| 18-16 | 15F | NA2 | 30 | 40 | wet solid | 02730-14G |
| 18-17 | 16A | Ox1 | 30 | 70 | extremely viscous, cloudy yellow, no flow | 02730-18A |
| 18-18 | 16A | IPA-OZ | 30 | 70 | extremely viscous, incomplete mix, brown, no flow | 02730-19A |
| 18-19 | 16A | NA2 | 30 | 70 | wet solid | |

| Formulation No. | RESIN | HARDENER/ REACTIVE DILUENT | PHR | TEMP., ° C. | FORMULATION PROPERTIES | NTBK. REF. |
|---|---|---|---|---|---|---|
| 18-43 | 16F | Ox1 | 30 | 70 | extremely viscous, clear light brown, almost no flow | 02730-18E |
| 18-44 | 16F | IPA-OZ | 30 | 70 | extremely viscous, incomplete mix, light brown, no flow | 02730-19E |
| 18-45 | 16F | NA2 | 30 | 70 | viscous, clear dark red brown, flows readily | |
| 18-46 | 16F | NA2 | 30 | 40 | flows readily | |
| 18-47 | 16F | NA3 | 30 | 70 | very viscous, clear red, flows slowly | 02730-22B |
| 18-48 | 16F | NA3 14A | 30 10 | 70 | extremely viscous, nearly black, no flow | 02730-24C |
| 18-49 | 16F | NA3 14A | 30 10 | 40 | extremely viscous, nearly black, no flow | 02730-28C |
| 18-50 | 16F | NA3 14B | 30 10 | 70 | extremely viscous, nearly black, no flow | 02730-24D |
| 18-51 | 16F | NA3 14B | 30 10 | 40 | extremely viscous, nearly black, no flow | 02730-28D |
| 18-52 | 16F | 14C | 30 | 40 | extremely viscous, clear light brown, no flow | 02730-44A |
| 18-53 | 16F | 14C | 30 | 70 | extremely viscous, clear light brown, no flow | 02730-45A |
| 18-54 | 16F | 14F | 30 | 40 | extremely viscous, clear light brown, no flow | 02730-44B |
| 18-55 | | 14F | 30 | 70 | extremely viscous, clear light brown, no flow | 02730-45B |
| 18-56 | 16F | 14G | 30 | 40 | extremely viscous, clear brown, no flow | 02730-44C |
| 18-57 | | 14G | 30 | 70 | extremely viscous, clear brown, no flow | 02730-45C |
| 18-58 | 16F | 14H | 30 | 40 | extremely viscous, clear brown, no flow | 02730-44D |
| 18-59 | | 14H | 30 | 70 | extremely viscous, clear brown, no flow | 02730-45D |
| 18-71 | 16G | 14G | 30 | 40 | extremely viscous, clear dark brown, no flow | 02730-44H |
| 18-72 | 16G | 14G | 30 | 70 | extremely viscous, clear dark brown, no flow | 02730-45H |
| 18-73 | 16G | 14H | 30 | 40 | extremely viscous, clear dark brown, no flow | 02730-44I |
| 18-74 | 16G | 14H | 30 | 70 | extremely viscous, clear dark brown, no flow | 02730-45I |
| 18-75 | 16G | 14I | 30 | 40 | extremely viscous, clear brown, flows slowly | 02730-44J |
| | | | 30 | 70 | extremely viscous, clear brown, flows slowly | 02730-45J |
| 18-76 | 16B/15C 3:1, wt. | NA2 | 30 | 40 | very viscous, clear brown, flows | 02730-26A |
| 18-77 | 16B/15C 3:1, wt. | NA2 14A | 30 10 | 40 | very viscous, clear brown, flows | 02730-26B |
| 18-78 | 16B/15C 3:1, wt. | NA2 14B | 30 10 | 40 | very viscous, clear brown, flows | 02730-26C |
| 1641-69 | 16H | Ox1 | 30 | 70 | extremely viscous, clear amber, no flow | 02730-60A |
| | 16H | NA2 | 30 | 70 | incomplete mixing | 02730-60B |
| | 16H | 14B | 30 | 70 | extremely viscous, nearly black, no flow | 02730-60C |
| 1641-70 | 16I | Ox1 | 30 | 70 | extremely viscous, clear amber, no flow | 02730-60D |
| | 16I | NA2 | 30 | 70 | incomplete mixing | 02730-60E |
| | 16I | 14B | 30 | 70 | extremely viscous, nearly black, no flow | 02730-60F |

Ox1 = 5-ethyl-1-aza-3,7-dioxabicyclo[3.3.0]octane
NA2 = 60/40 mixture (w/w) of 2-ethyl-2-nitro-1,3-propanediol with 2-nitro-1-butanol
NA3 = NA2 diluted with 25% (w/w) tris(hydroxymethyl)nitromethane A number of generalizations can be made from the formulation data in the Table:

It is clear from the results that the viscosity of the starting resin does not predict the viscosity of the formulation prepared with it. This is clearly demonstrated by formulation 18-2 in which novolac 15A—a viscous liquid—was blended with IPA-OZ—an oil. The resulting formulation was more viscous than the resin itself.

Formulation flow properties did not change as much as anticipated upon increasing the temperature from 400 to 70° C.

The most effective hardeners/reactive diluents in generating formulations that exhibited flow at 40° C. were Ox1 and NA2.

Resin molecular weight was not a good predictor of formulation viscosity.

The novolac resin most readily blended into flowable formulations was 16G.

Resin formulation viscosities can be improved by blending with lower viscosity resins. Formulations 18-76, 77, and 78 show blends of resins 16B with 15C that flow readily at 40° C. Similar formulations containing only 16B did not flow at 40° C. Given the results from Formulation 18-2, this is not an obvious outcome.

Example 6—DSC Curing Data For Selected Low Melting/Liquid Novolac Resin Formulations Those resin formulations that exhibited flow at 40° C. or 70° C. were selected for DSC analysis to determine their curing behavior. Some resin formulations that were too viscous to flow were also included. The reason for doing so was that the survey formulations were not optimized, and some of the very viscous formulations were based on resins that did generate other flowable formulations.

Curing performance data were obtained by running the DSC analyses at ΔT=10° C./minute from 25° C. to 250° C. under a nitrogen flow of 50 cc/minute. The samples were then held at 250° C. for 10 minutes, and then cooled to −50° C. The $T_g$ values of the cured formulations were then determined by running the DSC analyses at ΔT=10° C./minute from −50° C. to 250° C. under a nitrogen flow of 50 cc/minute. The samples were then cooled back to −50° C., and again re-heated to 250° C. as before. High volume (100 μL) pans were used for these analyses.

In many of these analyses, the curing events were not completed at the 250° C. temperature limit of the scan. In these cases, it was not possible to determine the heats of curing (J/g) since no baseline could be determined.

In some experiments, it was easier to detect the Tg during the cooling cycle of the run than in the re-heat cycle. In other experiments, no baseline deviations could be observed in either the heating or the cooling cycles. These samples either had $T_g$ values of >250° C. or they were lower in temperature but too small to be detected. The $T_g$ value was reported as "none" for these cured formulations.

The results of these curing studies are summarized in the Table below.

The resin formulations selected for DSC evaluations contained at least 30 phr of hardeners/reactive diluents, and most exhibited resin flow at 40° C. Formulations 18-63 and 18-64 had resin flow even at room temperature. All of these 100% solids, low-melting/liquid resin formulations showed good curing behavior by DSC.

Most of the formulations showed a single curing event. Curing onset temperatures ranged from as low as about 140° C. to as high as about 225° C., with curing peak temperatures ranging from 200° C. to as high as 250° C. As noted earlier, total heats of curing (J/g) were not possible to obtain in many experiments because the curing events were not completed before the 250° C. temperature limit of the experiment was reached, so no baseline could be determined.

As noted above, $T_g$ scans were run after holding the formulations at 250° C. for 10 minutes. In many experiments, no baseline deviations were observed either during the heating or cooling cycles of the experiments—thus, no $T_g$ observed below 250° C. In other experiments, only a weak transition—usually at <100° C.—could be observed during one of the cycles. This was recorded as a $T_g$ value, though it is questionable.

The data in the Table show a considerable variation in curing performance and in $T_g$ values, even for a given resin. This confirms that the choice of hardeners/reactive diluents can have a dramatic effect not only on the curing behavior of the formulations, but ultimately on the cured resin physical properties. This is in marked contrast to novolac resins cured using formaldehyde, paraformaldehyde, or hexa as the hardener.

Example 7—Composite Plague Preparation

It can be argued that, while the DSC confirms that these high solids, low-melting/liquid novolac resin formulations NOVEL PHENOLIC RESINS
CURE CONDITIONS: Scan from 25 C. to 250 C. at 10 C./minute using high volume pans; hold at 250 C. for 10 minutes; cool back to 25 C.; run Tg scan from −50 C. to 250 C..

| DSC CURE STUDIES | | | DSC CURING EVENTS | | | |
|---|---|---|---|---|---|---|
| Formulation No. | RESIN | FORMULATION Identification from ex. 5 | ONSET/PEAK TEMP, ° C. (HEAT, J/g) | ONSET/PEAK TEMP, ° C. (HEAT, J/g) | CURED RESIN Tg, ° C. | NTBK REF DSC DATA |
| 19-1 | 16G | 18-62 | 143/200 (105) | | (none) | 2074-28-20 |
| 19-2 | 16G | 18-63 | 227/242 | | 137 | 2074-28-21 |
| 19-3 | 16G | 18-64 | 226/244 | | 141 | 2074-28-22 |
| 19-4 | 16G | 18-65 | 225/235 | | 156 | 2074-28-23 |
| 19-5 | 16G | 18-66 | 226/235 | | 170 | 2074-28-24 |
| 19-6 | 16G | 18-75 | 162/201 (19) | | (none) | 2074-29-23 |
| 19-7 | 16G | 18-73 | 132/222 (64) | | (none) | 2074-29-22 |
| 19-8 | 16G | 18-67 | 153/206(111) | | (none) | 2074-29-21 |
| 19-9 | 15A | 18-1 | 215/243 | | 68, 176 | 2074-28-7 |
| 19-10 | 15A | 18-3 | 211/222 | 245 | 115 | 2074-28-8 |
| 19-11 | 15C | 18-7 | 209/233 | | 70 (?) | 2074-28-9 |
| 19-12 | 15C | 18-9 | 208/231 | | 130 | 2074-28-10 |
| 19-13 | 16B | 18-22 | 193/210(315) | | (none) | 2074-29-6 |
| 19-14 | 16B/15C 3:1 | 18-76 | 189/212(461) | | 160 | 2074-28-12 |
| 19-15 | 16B/15C 3:1 | 18-77 | 217/227 | 250 | 130 | 2974-28-13 |
| 19-16 | 16B/15C 3:1 | 18-78 | 209/221 | 244 | 147 | 2074-28-14 |
| 19-17 | 16F | 18-46 | 226/237 | | 172 | 2074-28-15 |
| 19-18 | 16F | 18-47 | 222/233 | | 165 | 2074-28-16 |
| 19-19 | 16F | 18-49 | 180/226 | | (none) | 2074-29-16 | exhibit exothermic events, they may represent hardener/resin decomposition rather than curing reactions. Similarly, the increase in—or absence of—$T_g$ values can be attributed to char formation rather than to cured resin. The definitive demonstration that these high solids, low-melting/liquid novolac resin formulations are useful in composite applications was to fabricate composite plaques. The resin selected for this demonstration was 16F, formulated with an Ox1—furfural—m-cresol hardener/reactive diluent combination.

Formulation Preparation: Novolac resin 16F (15 g) was weighed into a 4-oz jar and 3.4 g of Ox1 were added. The mixture was warmed in an oven at 70° C. to give a clear, viscous solution. While still at 70° C., a mixture of 5.44 g of Ox1, 3.65 g of furfural, and 4.11 g of m-cresol were added. The mixture was stirred at 70° C. to give a clear yellow solution. After cooling to room temperature, the formulation had the approximate consistency of honey.

Plaque Preparation: Woven fiberglass cloth (AircraftSpruce, #7781) was cut into 6-inch squares weighing approximately 6.9 g each. Plaques were constructed by placing a square of glass cloth onto a flat surface. Then 3-4 g of resin formulation were drizzled evenly over the cloth. The resin was spread over the entire surface of the square and worked into the fabric using a 4-inch ink roller. Four pieces of resin-impregnated glass cloth were then stacked in sandwich form and were compressed using the roller. The sandwich was then placed between two aluminum foil sheets and then between two 1/16-inch aluminum plates. The assembly was placed into a 185° C. forced air oven. After curing for 15 minutes, the composite plaque was removed and was cut in half. One half of the plaque was cooled to room temperature (Plaque A), and the other was cured for an additional 15 minutes (Plaque B).

Plaque A was a stiff, golden brown composite with no residual odor or tack. Plaque B was a stiff, dark brown composite, also having no residual odor or tack. The rigidity of the plaques and the absence of tack or odor indicated that the formulation was fully cured.

Example 8—Rapid Curing of Composite Plagues

For pultrusion, it is important to have a rapid cure formulation such that reasonable manufacturing rates can be achieved. Phenolic resoles are pultruded at rates varying from 10"/min up to 32"/min. As typical pultrusion die lengths are 36", in order to get a fully cured part at a rate of 18"/minute, it is necessary to achieve full cure in <2 minutes. A subset of our novel fully formulated high solids novolac resin systems were tested to see what temperature range would be required to achieve full cure in this time frame. Extent of cure was ascertained using visual and tactile impressions. The results are collected in the table.

| Experiment | Novolac Resin (R1) | Curing Agent(s) | Reactive Diluent(s) | Cure Temp. | Cure Time | Result |
|---|---|---|---|---|---|---|
| 2992-15 | 33.5 g | Ox1 (18.1) Ox3 (7) | Furfural (7) m-cresol (7) | 185 185 205 | 5 min 2 min 2 min | Fully cured Undercured Undercured |
| 2992-16 | 33.5 g | Ox1 (26.7) | m-cresol (12.4) | 205 205 225 | 3 min 1.5 1.5 | Fully cured Undercured Fully cured |
| 2992-18 | 33.3 g | Ox1 (12.7) Ox2 (23) | m-cresol (12.4) | 185 | 1.5 | Fully cured |
| 2992-26 | 50 g* | HHP (18) LNA-25 (18) | m-cresol (16.6) | 120 120 | 3 1.5 | Fully cured Undercured |
| 2992-36 | 33.3** | Ox1(8) HHP (12.8) | 11.1 | 205 | 1 | Fully cured |
| 2992-45 | 37.5 | Ox1 (7.5) | Furfuryl alcohol (12.5) | 225 | 1.5 | Fully cured |
| 2992-46 | 37.5 | Ox1 (12.9) | RD1 (12.5) | 225 225 | 0.75 0.33 | Fully cured Undercured |

*contained 10 mL methanol in addition to the 50 g resin
**contained 5 mL methanol in addition to the 33.3 g resin
Ox3 = Bonding Agent M-3P
HHP = N,N'-bis(2-propyl)-5-hydroxymethyl-5-nitro-1,3-hexahydropyrimidine
LNA25 - mixture of 2-nitro-2-ethyl-1,3-propanediol (0.45 mol eq), 2-nitro-1-butanol (0.3 mol eq) and tris(hydroxymethyl)nitromethane (0.25 mol eq) in methanol (25% w/w)

Clearly the data indicate that reasonable pultrusion rates (e.g. at least 12"/min) should be obtainable with all of the formulations if the temperature is sufficiently high. Additionally, as expected, the extent of cure for a given cure cycle increases with higher temperature.

Example 9—Pultrusion Studies

Pultrusion studies were performed on a Pulstar 804 instrument using a 1"×1/8" die profile. Electric platens were used to heat the 36" die in three independent 12" zones. Johns Manville 507A continuous glass rovings were used; 32 ends of glass were used to create a part with 68% (vol/vol) glass/32% resin. Three-point flexural testing was performed on 5" long specimens, with a span width of 4 inches, on an MTS mechanical tester. Three identical parts were subjected to testing and the average value reported. The procedure followed was ASTM D-790-90.

Based on the results obtained in the previous examples, a series of formulations were prepared and tested in actual pultrusion trials. Formulations with 100% solids and formulations containing minimal amounts of inert solvents were used. A comparison to a commercially available resole-based phenolic pultrusion resin was made. The pultrusion processability, pultrusion speed, part finish, and mechanical integrity of the completed part were evaluated. The formulations tested are shown in the Table below, and in all cases, viable solid parts were obtained.

| Formulation | Resin | Oxazolidine | Nitroalcohol | Reactive Diluent | Solvent | Release Agent |
|---|---|---|---|---|---|---|
| ANGA01 | 2603 (R1) | 1062 (Ox1) | 250 (NA1) | None | 459 | 76 (RA1) |
| ANGA02 | 2603 (R1) | 1062 (Ox1) | 250 (NA1) | None | 459 | 135 (RA1) |
| ANGA03 | 3825 (R1) | 1676 (Ox1) | None | None | 675 | 186 (RA1) |
| ANGA04 | 3825 (R1) | 1676 (Ox1) | None | 1000 (RD1) | 675 | 186 (RA1) |
| ANGA05 | 2475 (R1) | 1386 (Ox1) | None | 400 (RD2) | 225 | 112 (RA1) |
| ANGA06 | 2475 (R1) | 1386 (Ox1) | None | 400 (RD2) | 225 | 112 (RA1) |
| ANGA07 | 2250 (R1) | 1550 (Ox1) | None | 750 (RD2) | None | 114 (RA1) |
| ANGA08 | 2550 (R1) | 560 (Ox1)/ 1010 (Ox2) | None | None | 450 | 119 (RA1) |
| ANGA09 | 2550 (R1) | 960 (Ox1) | 196 (NA2) | None | 450 | 106 (RA1) |
| ANGA10 | 2550 (R1) | 1120 (Ox1) | None | None | 658** | 120 (RA1) |
| ANGB01 | 2357 (R2) | 1083 (Ox1) | None | 435 (RD1) | 516 | 114 (RA1) |
| ANGB02 | 2355 (R2) | 1080 (Ox1) | None | 422 (RD1) | 516 | 112 (RA2) |
| ANGB03 | 2354 (R2) | 1080 (Ox1) | None | 421 (RD1) | 515 | 136 (RA3) |
| ANGB04 | 2354 (R2) | 1081 (Ox1) | None | 420 (RD1)/ 121 (RD3) | 565 | 137 (RA3) |
| ANGB05 | 3060 (R2) | 1409 (Ox1) | None | 1106 (RD1)/ 156 (RD3) | 735 | 196 (RA3) |
| ANGB07 | 2706 (R2) | 745 (Ox1) | None | 163 (RD3) | 678 | 135 (RA3) |
| ANGB08 | 3239 (R2) | 1495 (Ox1) | None | None | 637 | 227 (RA3) |
| ANGC01 | 3239 (R2) | 1490 (Ox1) | None | None | 642 | 170 (RA3) |
| ANGC02 | 3239 (R4) | 1500 (Ox1) | None | None | 804 | 170 (RA3) |
| ANGC03 | 3239 (R2) | 1490 (Ox1) | None | None | 642 | 170 (RA4) |
| ANGC04 | 3239 (R2) | 1490 (Ox1) | None | None | 642 | 170 (RA5) |
| ANGC06 | 3221 (R5) | 1480 (Ox1) | None | None | 818 | 170 (RA3) |
| ANGC07 | 3239 (R4) | 1190 (Ox1) | None | None | 789 | 165 (RA3) |
| ANGC08 | 3239 (R4) | 1785 (Ox1) | None | None | 816 | 181 (RA3) |
| ANGC09 | 3239 (R4) | 1500 (Ox1) | None | None | 804 | 170 (RA5) |
| ANGC10 | 3239 (R2) | 1490 (Ox1) | None | None | 692* | 170 (RA3) |
| ANGC11 | 3239 (R2) | 1490 (Ox1) | None | None | 642 | 170 (RA3) |
| ANGC12 | 3239 (R2) | 1190 (Ox1) | None | None | 692 | 157 (RA3) |
| ANGC13 | 3239 (R4) | 1500 (Ox1) | None | None | 804 | 170 (RA3) |
| Control | 5788 (R3) | None | None | None | Unknown | 174 (RA1) |

R1 - Phenolic novolac with minimal residual phenol (<1%), resin as prepared (non-neutralized)
R2 - Phenolic novolac with residual phenol (<10%), resin as prepared (non-neutralized)
R3 - Cellobond J20 resole resin in water
R4 = Phenolic novolac with residual phenol (<10%), resin partially neutralized with base
R5 = Phenolic novolac with residual phenol (<10%), resin partially neutralized with base
Ox1 = 5-ethyl-1-aza-3,7-dioxabicyclo[3.3.0]octane
Ox2 = 4,4-dimethyl-1-oxa-3-azacyclopentane
NA1 = Tris(hydroxymethyl)nitromethane in water (50/50 by wt.)
NA2 = 60/40 mixture (w/w) of 2-ethyl-2-nitro-1,3-propanediol with 2-nitro-1-butanol
RD1 = Durite SL-486A phenolic resole resin
RD2 = m-cresol
RD3 = Low MW, solid phenolic novolac prepared from phenol/formaldehyde/hexamethylenetetramine
RA1 = Axel 1850HT
RA2 = Axel XP Pul14D
RA3 = Techlube 721 ZL
RA4 = Axel XPPul-14K
RA5 = Axel XPPul-14PP
*additionally contained 120 g 1,1,3,3-tetramethylguanidine
**additionally contained 510 g solid aluminum tri-hydrate powder as a filler.

The surface finish of the parts was in large part attributable to the release agent used. The parts made using RA1, RA2, RA4 and RA5 had a significant amount of surface dust, although once cleaned the parts were smooth. Parts made using RA3 did not have any dusting, and were very smooth and glossy.

The successful processing of the formulations was also affected by the selection of release agent. Again, RA1, RA2, RA4 and RA5 were similar in that while they allowed successful pultrusion, process changes or upsets often caused part failure in the die. Release agent RA3 was shown to provide much more latitude in varying pultrusion parameters.

The effects of pultrusion process parameters on part integrity are discussed in subsequent examples.

Example 10—Effect of Temperature on Cure Speed

Using three nearly identical formulations, a study of cure speed versus die temperatures was conducted. Analogous to the plaque curing experiments, it was seen that an increase in die temperature allowed an increase in pull rates while still generating a solid part.

| Formulation | Zone 1 (die entrance) | Zone 2 (center of die) | Zone 3 (die exit) | Pull Speed | Result |
|---|---|---|---|---|---|
| ANGA03 | 400 | 450 | 425 | 18"/min | Solid part |
|  | 400 | 450 | 425 | 24"/min | Soft part |
| ANGB08 | 460 | 485 | 485 | 24"/min | Solid part |
|  | 490 | 510 | 510 | 32"/min | Solid part |
|  | 490 | 510 | 510 | 36"/min | Solid part |
|  | 490 | 510 | 510 | 40"/min | Soft part |
| ANGC11 | 525 | 525 | 525 | 44"/min | Solid part |
|  | 525 | 525 | 525 | 48"/min | Solid part |
|  | 525 | 525 | 525 | 52"/min | Soft part |

| Formulation | Zone 1 (die entrance) | Zone 2 (center of die) | Zone 3 (die exit) | Pull Speed | Result |
|---|---|---|---|---|---|
| Cellobond J20 Control* | 375 | 400 | 400 | 12"/min | Solid part |

*Processed using the recommended settings from the manufacturer.

Example 11—Effect of Resin/Hardener Ratio

Using pultrusion conditions shown to produce fully cured, viable parts for each formulation, a demonstration of the effect of resin/hardener ratio on physical properties of the cured parts was performed. As can be seen in the table, the ratio of resin/hardener may be varied significantly while still maintaining physical properties superior to the resole control.

| Formulation | Resin/ Hardener Ratio (w/w) | Peak Load (lbs) | Peak Stress (ksi) | Modulus (Mpsi) | % Strain at Break |
|---|---|---|---|---|---|
| ANGC07 | 2.72 | 536 | 192 | 7.2 | 2.9 |
| ANGC08 | 1.81 | 480 | 169 | 7.0 | 2.5 |
| ANGC13 | 2.16 | 563 | 205 | 7.2 | 3.1 |
| Cellobond J20 Control | Not Applicable | 441 | 154 | 7.0 | 2.4 |

Example 12—Effect of Resin Neutralization

As discussed above, to get within the desired pH range, the resin may be either used as manufactured, acidified or basified depending on the method of manufacture. As seen in the table, we have demonstrated that resin treated with base can have an impact on the rate of pultrusion and the final part integrity.

| Formulation | Base added to Resin | Maximum Pull Rate @ 525 F. | Peak Load (lbs) | Peak Stress (ksi) | Modulus (Mpsi) | % Strain at Break |
|---|---|---|---|---|---|---|
| ANGC11 | No | <48"/min | 531 | 193 | 7.1 | 2.9 |
| ANGC06 | Yes | >72"/min | 373 | 130 | 6.8 | 1.9 |

Example 13—Effect of Reactive Diluents

It may be desirable to add reactive diluents or alternative cross-linking agents to a formulation to vary viscosity, solvent level, mechanical properties of the cured part, reactivity, formulation cost or other considerations. As shown in the table, a variety of materials may be added while still maintaining the ability to produce viable pultruded parts. All formulations shown produced solid, fully cured, viable parts.

| Formulation | Resin | Oxazolidine | Nitroalcohol | Reactive Diluent | Solvent | Release Agent |
|---|---|---|---|---|---|---|
| ANGA02 | 2603 (R1) | 1062 (Ox1) | 250 (NA1) | None | 459 | 135 (RA1) |
| ANGA04 | 3825 (R1) | 1676 (Ox1) | None | 1000 (RD1) | 675 | 186 (RA1) |
| ANGA05 | 2475 (R1) | 1386 (Ox1) | None | 400 (RD2) | 225 | 112 (RA1) |
| ANGA07 | 2250 (R1) | 1550 (Ox1) | None | 750 (RD2) | None | 114 (RA1) |
| ANGA08 | 2550 (R1) | 560 (Ox1)/ 1010 (Ox2) | None | None | 450 | 119 (RA1) |
| ANGA09 | 2550 (R1) | 960 (Ox1) | 196 (NA2) | None | 450 | 106 (RA1) |
| ANGB04 | 2354 (R2) | 1081 (Ox1) | None | 420 (RD1)/ 121 (RD3) | 565 | 137 (RA3) |
| ANGB05 | 3060 (R2) | 1409 (Ox1) | None | 1106 (RD1)/ 156 (RD3) | 735 | 196 (RA3) |
| ANGB07 | 2706 (R2) | 745 (Ox1) | None | 163 (RD3) | 678 | 135 (RA3) |
| ANG A10 | 2550 (R1) | 1120 (Ox1) | None | None | 658* | 120 (RA1) |

*Additionally contained 510 g solid aluminum tri-hydrate as a filler

Example 14—FST Testing

To demonstrate the excellent FST properties obtainable with the novel systems of our invention, ASTM E662-95 testing was performed on parts generated via the pultrusion of formulations ANGA03 and ANGA04. Testing in both flaming and non-flaming mode was completed. The results are shown in the table:

| Formulation | Dm (ave) Flaming Mode | Dm (ave) Non-Flaming mode |
|---|---|---|
| ANGA03 | 13.04 | 11.57 |
| ANGA04 | 9.52 | 6.22 |

These results clearly show that our two part resin formulation based on resin (a) and hardener (b) is sufficient to provide composite parts with outstanding FST properties. The use of a reactive diluent has also been shown to be potentially advantageous in further improving FST performance.

Example 15—Filament Winding

The pultrusion examples clearly demonstrate that once applied to a fibrous substrate, the formulations of this invention may be cured via the application of heat to form a solid part. Filament winding is another manufacturing technique often used to prepare complex composite parts. The formulations of this invention are equally applicable to the manufacture of filament wound composite parts.

As a demonstration of filament winding, continuous glass roving was fully impregnated with formulation ANGC13 and wound at room temperature onto a cylindrically shaped mandrel. The mandrel was placed into an oven and, with continued rotation, warmed from 25 to 125 C over 30 minutes, then held at 125 C for an additional 20 minutes. After cooling, the fully cured, solid composite cylindrically shaped tube was removed from the mandrel.

What is claimed is:

1. A composition for the manufacture of composites comprising:
   i) a formulated resin system comprising:
      a. a novolac resin prepared from a phenolic compound and an aldehyde, wherein the phenolic compound is selected from the group consisting of phenol, bisphenol, phloroglucinol, cresols, alkyl phenols, phenol ethers, tannins and lignins, and wherein the ratio of aldehyde to phenolic compound is less than one; and
      b. a non-formaldehyde hardener selected from the group consisting of oxazolidines, nitroalcohols, nitrones, halonitroparaffins, oxazines, azaadamantanes, hexamethylenetetramine salts, nitroamines, imidazolidines, triazines, nitrooxazolidines, and imidazolidine-oxazolidine hybrids; and
   ii) a fibrous substrate.

2. The composition of claim 1 wherein the resin system further comprises an additional component selected from the group consisting of internal release agents, inert solvents, reactive diluents, fillers and colorants.

3. The composition of claim 2 wherein the inert solvent is selected from the group consisting of lower alcohols, glycols, glycol derivatives, esters, water and benzyl alcohol.

4. The composition of claim 2 wherein the reactive diluent is selected from the group consisting of phenolic monomers, furfural and furfuryl alcohol.

5. The composition of claim 1 wherein the non-formaldehyde hardener comprises an oxazolidine mixed with a nitroalcohol.

6. The composition of claim 2 wherein the resin system is comprised of:
   a. 45-85% by weight of novolac resin;
   b. 15-55% by weight of non-formaldehyde hardener;
   c. 0-6% by weight of internal release agent;
   d. 0-30% by weight of inert solvents;
   e. 0-50% by weight of reactive diluent;
   f. 0-40% by weight of filler; and
   wherein the formulated resin system has a viscosity <1MM cps at 25° C.

7. The composition of claim 1 wherein the non-formaldehyde hardener is ethyl-1-aza-3,7-dioxabicyclo[3.3.0]octane.

8. The composition of claim 1 wherein the fibrous substrate is a mat.

9. The composition of claim 1 wherein the fibrous substrate is a fiber.

10. The composition of claim 1 wherein the fibrous substrate is glass roving.

11. The composition of claim 1 wherein the fibrous substrate is selected from the group consisting of glass, carbon, basalt, graphite, synthetic fibers, and synthetic mats.

12. The composition of claim 1 which is suitable for use in pultrusion processing or filament winding.

* * * * *